US007119606B2

(12) United States Patent
Fahim

(10) Patent No.: US 7,119,606 B2
(45) Date of Patent: Oct. 10, 2006

(54) LOW-POWER, LOW-AREA POWER HEADSWITCH

(75) Inventor: Amr Fahim, Solana Beach, CA (US)

(73) Assignee: QUALCOMM, Incorporated, San Diego, CA (US)

(*) Notice: Subject to any disclaimer, the term of this patent is extended or adjusted under 35 U.S.C. 154(b) by 282 days.

(21) Appl. No.: 10/617,897

(22) Filed: Jul. 10, 2003

(65) Prior Publication Data

US 2005/0007178 A1 Jan. 13, 2005

(51) Int. Cl.
*G05F 1/10* (2006.01)

(52) U.S. Cl. ...................................... 327/541; 327/536

(58) Field of Classification Search ................ 323/269, 323/311; 327/108, 109, 110, 111, 390, 403, 327/404, 534, 535, 536, 537, 538, 539, 540, 327/541, 543

See application file for complete search history.

(56) References Cited

U.S. PATENT DOCUMENTS 4,965,696 A * 10/1990 Kumpfmueller et al. .... 361/160
5,212,456 A 5/1993 Kovalcik et al. ........... 330/261
5,387,830 A * 2/1995 Kukimoto ................... 327/322
5,404,053 A * 4/1995 Poma et al. ................ 327/108
5,689,208 A * 11/1997 Nadd ......................... 327/390
5,708,343 A * 1/1998 Hara et al. .................. 318/599
5,767,729 A 6/1998 Song .......................... 327/390
5,977,743 A * 11/1999 Flock ......................... 318/811
6,040,736 A * 3/2000 Milanesi et al. ............ 327/541
6,049,201 A * 4/2000 Feldtkeller .................. 323/288
6,295,189 B1 * 9/2001 Perelle et al. ................. 361/55
6,777,920 B1 * 8/2004 Furutani et al. ............ 323/280
2003/0030484 A1 2/2003 Kang et al. ................. 327/544

FOREIGN PATENT DOCUMENTS

JP 3168963 6/2003

* cited by examiner

*Primary Examiner*—Jeffrey Zweizig
(74) *Attorney, Agent, or Firm*—Philip R. Wadsworth; Charles D. Brown; Alex C. Chen

(57) ABSTRACT

An N-FET headswitch has improved performance (e.g., less leakage current, lower ON resistance, and smaller area) over a conventional P-FET headswitch. The N-FET headswitch includes at least one N-FET device and couples between a power supply and a load circuit, which may be, e.g., a microprocessor, a digital signal processor, or a memory unit. The headswitch couples the power supply to the load circuit when the headswitch is enabled and cuts off the power supply from the load circuit when disabled. A charge pump couples to the headswitch and provides a control signal. This control signal is sufficiently high when the headswitch is enabled to ensure that the N-FET device operates in a linear region and has a small drain to source voltage drop. The headswitch may be operated as a power switch or in a feedback configuration to implement a linear or a digital voltage regulator.

21 Claims, 3 Drawing Sheets

LOW-POWER, LOW-AREA POWER HEADSWITCH

BACKGROUND

I. Field

The present invention relates generally to circuits, and more specifically to a power headswitch.

II. Background

Integrated circuit (IC) fabrication technology continually improves and, as a result, the size of transistors continues to shrink. This enables more transistors and more complicated circuits to be fabricated on an IC die or, alternatively, a smaller die to be used for a given circuit. Smaller transistor size also supports faster operating speed and provides other benefits.

For complementary metal oxide semiconductor (CMOS) technology, which is widely used for digital circuits and some analog circuits, a major issue with shrinking transistor size is standby power. A smaller transistor geometry results in higher electric field (E-field), which stresses a transistor and causes oxide breakdown. To decrease the E-field, a lower power supply voltage is often used for smaller geometry transistors. Unfortunately, the lower power supply voltage also increases the delay of the transistors, which is undesirable for high-speed circuits. To improve the delay, the threshold voltage of the transistors is reduced. However, the lower threshold voltage and smaller transistor geometry result in higher leakage current (or standby current), which is the current passing through a transistor when it is turned off.

Leakage current becomes more problematic as CMOS technology scales smaller. It can be shown that leakage current increases at a high rate with respect to the decrease in transistor size. To illustrate the point, a microprocessor implemented in 0.13 μm (micrometer) CMOS technology may dissipate tens of micro-amps to one milli-amp in standby current when it is powered down. In contrast, it has been estimated that with current technology trends the same microprocessor implemented in 30 nm (nanometer) CMOS technology may dissipate as much as one Ampere of standby current when powered down, which is a thousand or more times greater than the standby current for 0.13 μm CMOS technology. (0.13 μm and 30 nm refer to the "feature" or device length, which is the effective length of a transistor implemented by the CMOS technology.) Leakage current consumes power and reduces standby time for a portable device (e.g., a cellular phone) that uses battery power.

One method of combating high leakage current and reducing standby power consumption in large digital VLSI (very large scale integration) designs is to cut off the power supply to a digital circuit when it is turned off. The power supply may be cut off with either a headswitch or a footswitch. A headswitch is a switch placed between the power supply and the digital circuit. A footswitch is a switch placed between the digital circuit and circuit ground.

A headswitch is conventionally implemented with a P-channel field effect transistor (P-FET) device, which is also referred to as a P-channel transistor. The P-FET device is designed with a sufficiently large size (i.e., the width of the device is sufficiently wide) so that the ON resistance is small and the voltage drop across the device is reduced when the device is turned on. This ensures that power dissipation by the P-FET device is within a desired limit when the device is turned on. However, the large P-FET device size also results in high leakage current when the device is turned off, which is undesirable. Moreover, other issues are encountered when the P-FET device is used as a headswitch, as described below.

There is therefore a need in the art for a headswitch with improved performance over the conventional P-FET headswitch.

SUMMARY

A low-power, low-area headswitch having improved performance over the conventional P-FET headswitch is provided herein. The inherent higher (electron) mobility of N-channel FET (N-FET) devices over P-FET devices is exploited to implement an N-FET headswitch having less leakage current, lower ON resistance, and smaller device size than for a P-FET headswitch.

In an embodiment, an electronic circuit comprised of a load circuit and a headswitch is provided. The load circuit includes at least one FET device and may be, for example, a microprocessor, a digital signal processor, a memory unit, and so on. The headswitch includes at least one N-FET device and couples between a power supply and the load circuit. The headswitch couples the power supply to the load circuit when the headswitch is enabled and cuts off the power supply from the load circuit when disabled. The electronic circuit may further comprise a charge pump that couples to the headswitch and provides a control signal for the headswitch. The control signal is sufficiently high (e.g., equal to or exceeding the power supply voltage plus the threshold voltage of the N-FET device) when the headswitch is enabled to ensure that the N-FET device operates in a linear region and has a small drain-to-source voltage drop. The headswitch may be operated as a power switch (on or off) or included in a feedback configuration to implement a linear voltage regulator or a digital voltage regulator, as described below.

Various aspects, embodiments, and features of the invention are described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
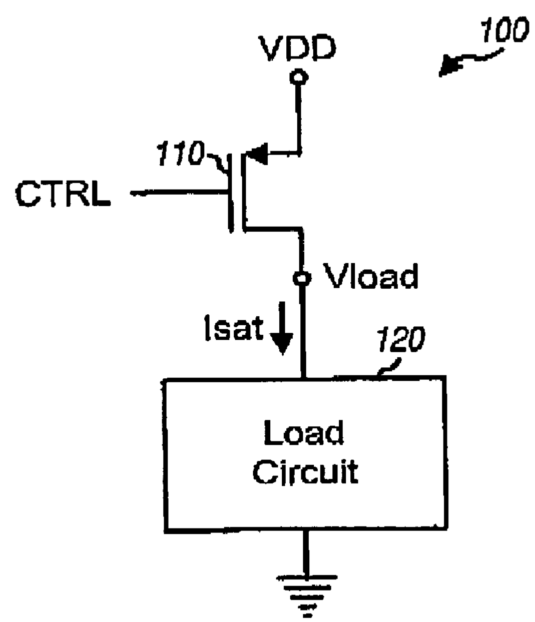
FIG. 1 shows an electronic circuit with a conventional P-FET headswitch.

FIG. 1 shows a schematic diagram of an electronic circuit 100 with a conventional P-FET headswitch. Circuit 100 includes a P-FET device 110 coupled to a load circuit 120. P-FET device 110 implements the P-FET headswitch. P-FET device 110 has a source that couples to a power supply, VDD, a gate that receives a control signal CTRL, and a drain that provides a load supply, Vload. Load circuit 120 couples between the load supply and circuit ground.

As used herein, a "load circuit" is a circuit comprised of at least one FET device (i.e., N-FET and/or P-FET devices) and configured to receive power via a headswitch. The load circuit is powered on when the headswitch is enabled and powered off when the headswitch is disabled. The load circuit may be a microprocessor, a digital controller, a digital signal processor (DSP), a memory unit, an input/output (I/O) unit, a digital circuit, an analog circuit, an IC, an IC die, or some other circuit.

The P-FET headswitch in FIG. 1 operates as follows. If the control signal CTRL is logic low (e.g., near circuit ground), then P-FET device 110 is turned on and the load supply, Vload, is approximately equal to the power supply, VDD. Load circuit 120 is then powered on and operates in its intended manner. Conversely, if the control signal CTRL is logic high (e.g., near the power supply voltage), then P-FET device 110 is turned off and the load supply, Vload, is pulled toward circuit ground by load circuit 120. Load circuit 120 is then powered off. The saturation current, Isat, refers to the current consumed by load circuit 120 when it is powered on.

P-FET device 110 is dimensioned with a sufficiently large width such that the ON resistance of the device is small and the drain-to-source voltage, $V_{DS}$, drop across the device is reduced, given the maximum expected circuit load, when the device is turned on. The large width results in a large leakage current when P-FET device 110 is turned off. To reduce the leakage current, P-FET device 110 is sometimes turned off harder by bringing the control signal CTRL higher than the power supply voltage (i.e., CTRL>VDD). However, this overstresses P-FET device 110 since the gate voltage is higher than the power supply voltage, VDD, while one of the diffusion voltages reaches zero volts (i.e., the device is overstressed when either the gate-to-source voltage, $V_{GS}$, or the gate-to-drain voltage, $V_{GD}$, is greater than VDD). This overstress may compromise the reliability of P-FET device 110 and shorten its life expectancy.

Figure 2:
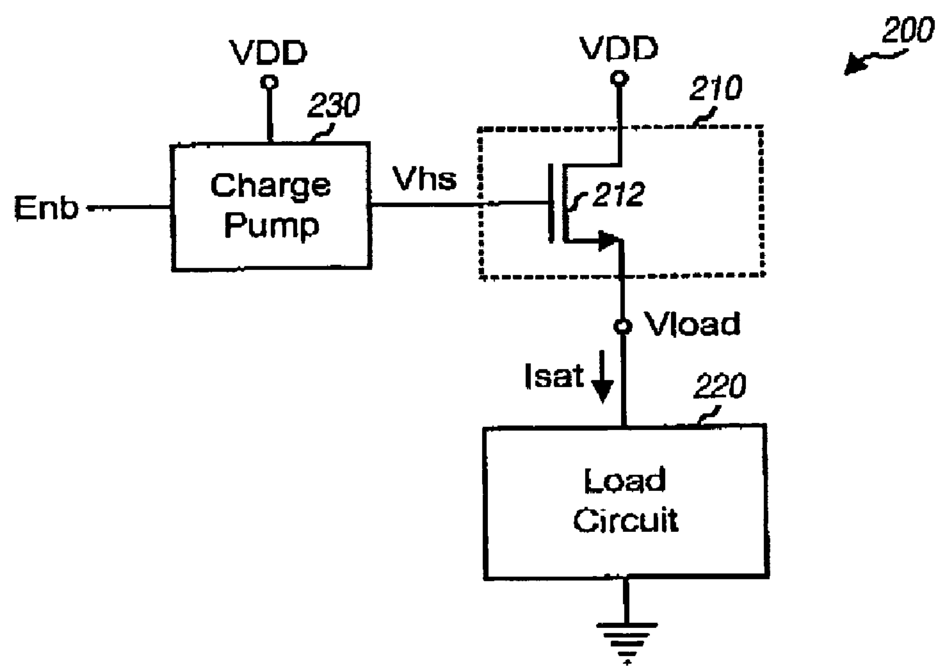
FIG. 2 shows an electronic circuit with an innovative N-FET headswitch.

FIG. 2 shows a schematic diagram of an electronic circuit 200 with an innovative N-FET headswitch. Circuit 200 includes an N-FET headswitch 210 coupled to a load circuit 220 and a charge pump 230. N-FET headswitch 210 is implemented with an N-FET device 212. N-FET device 212 has a drain that couples to the power supply, VDD, a gate that receives a headswitch control signal, Vhs, from charge pump 230, and a source that provides the load supply, Vload. Load circuit 220 couples between the load supply and circuit ground. Electronic circuit 200 may be implemented within a single IC, multiple ICs, an IC die, and so on. (An IC may include multiple IC dies.) For example, N-FET headswitch 210 and load circuit 220 may be implemented within the same integrated circuit.

The threshold voltage, Vth, of a FET device determines the voltage at which the device turns on. A low threshold voltage corresponds to lower ON resistance for the FET device but results in larger leakage current. Conversely, a high threshold voltage corresponds to higher ON resistance for the FET device but results in smaller leakage current. Lower ON resistance typically reduces the delay of the FET device and allows the device to operate at higher speed. The threshold voltage is dependent on the CMOS technology used to fabricate the FET device. A dual-Vth CMOS technology allows for fabrication of both low-Vth and high-Vth FET devices on the same die. Since speed is normally not critical for a headswitch, a high-Vth N-FET device may be used for the headswitch, if available. However, the N-FET headswitch may be implemented with low-Vth or high-Vth N-FET devices.

N-FET headswitch 210 operates as follows. If the headswitch control signal, Vhs, is high (e.g., Vhs≧VDD), then N-FET device 212 is turned on and provides the load supply, Vload. Load circuit 220 is then powered on and operates in its intended manner. Conversely, if the headswitch control signal, Vhs, is low (e.g., near circuit ground), then N-FET device 212 is turned off and the load supply, Vload, is pulled toward circuit ground by load circuit 220. Load circuit 220 is then powered off.

N-FET device 212 operates in a saturation region if the headswitch control signal, Vhs, is equal to the power supply voltage VDD (i.e., Vhs=VDD). In this case, the voltage drop across the drain to source of N-FET device 212 is approximately equal to the threshold voltage (i.e., $V_{DS}$≈Vth), and the load supply voltage is decreased by the $V_{DS}$ voltage drop (i.e., Vload≈VDD−Vth). N-FET device 212 dissipates power due to the $V_{DS}$ voltage drop. To reduce this power dissipation, N-FET device 212 may be operated in a linear region by providing a headswitch control signal that is at least Vth higher than the power supply voltage (i.e., Vhs≧VDD+Vth). In this case, the drain-to-source voltage, $V_{DS}$, is approximately equal to zero (i.e., $V_{DS}$≈0), the load supply voltage is approximately equal to the power supply voltage (i.e., Vload≈VDD), and the power dissipation by N-FET device 212 is small.

Charge pump 230 receives a charge pump control signal, Enb, that enables or disables the charge pump. Charge pump 230 performs voltage multiplication of the power supply voltage, VDD, when enabled by the charge pump control signal, Enb, and provides the headswitch control signal, Vhs, which can be higher than the power supply voltage, VDD. If the charge pump control signal, Enb, is at logic low (e.g., near circuit ground), then charge pump 230 is disabled, the headswitch control signal, Vhs, is at a low voltage, and N-FET device 212 is turned off. Conversely, if the charge pump control signal, Enb, is at logic high (e.g., near the power supply voltage), then charge pump 230 is enabled, the headswitch control signal, Vhs, is higher than the power supply voltage, VDD, and N-FET device 212 is turned on. An exemplary design of charge pump 230 is described below.

An N-FET headswitch can provide various advantages over a P-FET headswitch, as described below. An N-FET headswitch is also preferred over an N-FET footswitch for certain applications. For example, multiple N-FET headswitches may be used to control different power regimes in an electronic circuit. Each power regime refers to a different power supply voltage and/or power source. For example, a first N-FET headswitch may couple a first power regime to one portion of an electronic circuit, a second N-FET headswitch may couple a second power regime to another portion of the electronic circuit, and so on.

FIG. 2 shows an implementation of N-FET headswitch 210 with a single N-FET device 212. The size of N-FET device 212 is selected to be sufficiently large so that power dissipation by the FET device with the maximum expected load is within a tolerable limit (i.e., a predetermined percent of total power of the headswitch and load circuit). Moreover, the voltage drop across head switch 210 at maximum load current is within a tolerable limit.

Figure 3:
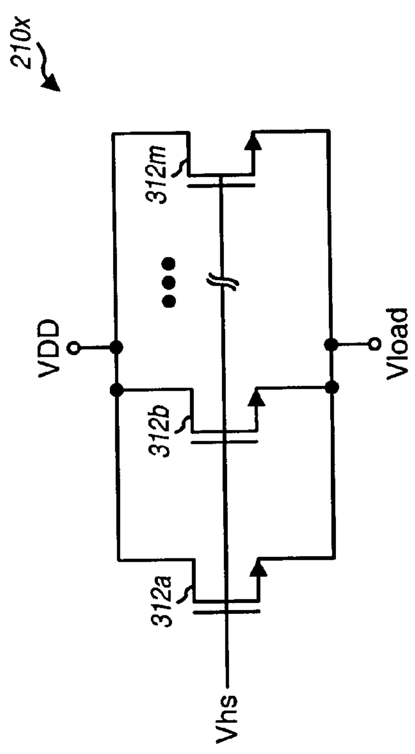
FIG. 3 shows an N-FET headswitch with multiple N-FET devices.

FIG. 3 shows a schematic diagram of an N-FET headswitch 210*x*, which is another embodiment of an N-FET headswitch and may be used in FIG. 2. For this embodiment, N-FET headswitch 210*x* comprises M N-FET devices 312*a* through 312*m* coupled in parallel, where M is an integer greater than one. As shown in FIG. 3, N-FET devices 312*a* through 312*m* have drains that couple together and to the power supply, VDD, gates that couple together and receive the headswitch control signal, Vhs, and sources that couple together and provide the load supply, Vload.

Implementation of N-FET headswitch 210*x* with multiple N-FET devices 312 reduces the ON resistance of the headswitch, which then reduces both the voltage drop across the headswitch and the power dissipation by the headswitch when it is turned on. The M N-FET devices 312*a* through 312*m* may be placed near each other on an IC die or dispersed throughout the IC die.

Figure 4:
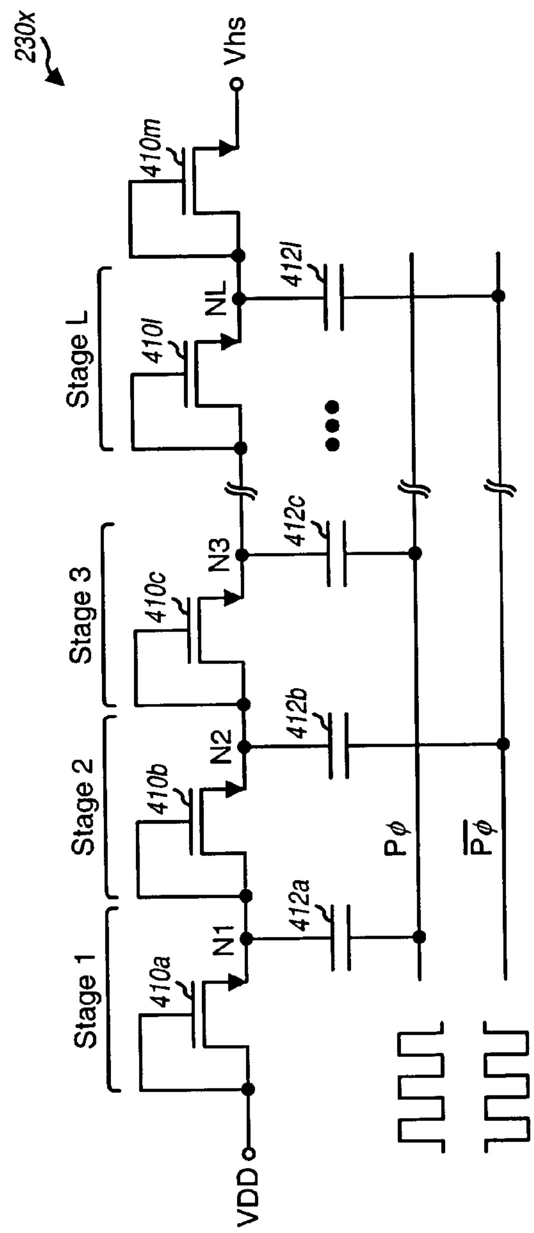
FIG. 4 shows an L-stage charge pump.

FIG. 4 shows a schematic diagram of an L-stage charge pump 230*x*, which may be used for charge pump 230 in FIG. 2. Charge pump 230*x* includes (L+1) N-FET devices 410*a* through 410*m* and L capacitors 412*a* through 412*l*. N-FET devices 410*a* through 410*m* couple in series, with the source of each N-FET device being coupled to the drain of the next N-FET device. The drain of N-FET device 410*a* receives the power supply voltage, VDD, and the source of N-FET device 410*m* provides the headswitch control signal, Vhs. Each N-FET device 410 is also configured as a diode and has its gate and drain coupled together. Capacitors 412*a* through 412*l* have one end coupled to the source of N-FET devices 410*a* through 410*l*, respectively. The other end of capacitors 412*a*, 412*c*, and so on for odd-numbered stages couples to a control signal Pϕ. The other end of capacitors 412*b* and so on for even-numbered stages couples to a complementary control signal $\overline{P\phi}$. The control signals Pϕ and $\overline{P\phi}$ are complementary clock signals that transition between logic high (e.g., the power supply voltage) and logic low (e.g., circuit ground). The control signals Pϕ and $\overline{P\phi}$ may be viewed as one form of the charge pump control signal, Enb, in FIG. 2.

Charge pump 230*x* operates as follows. Initially, the L capacitors 412*a* through 412*l* are discharged, and the voltage across each capacitor is zero. During clock phase ϕ1, the control signal Pϕ is at circuit ground, N-FET device 410*a* conducts as a diode until the voltage at node N1 becomes (VDD−Vth). During clock phase ϕ2, which is complementary to clock phase ϕ1, the control signal Pϕ is at VDD, the voltage at node N1 is increased by VDD and becomes VDD+(VDD−Vth), the control signal $\overline{P\phi}$ is at circuit ground, and N-FET device 410*b* conducts as a diode until the voltage at node N2 becomes 2·(VDD−Vth). When the control signal $\overline{P\phi}$ goes high again, the voltage at node N2 is increased by VDD and becomes VDD+2·(VDD−Vth). After L stages, it can be shown that the voltage at the output of charge pump 230*x* is:

$$Vhs=(L+1)\cdot(VDD-Vth). \qquad \text{Eq (1)}$$

As shown in equation (1), voltage multiplication is achieved because the power supply voltage VDD is greater than the threshold voltage (i e., VDD>Vth).

Charge pump 230*x* successively pumps charge along the chain of N-FET devices 410*a* through 410*m*. Each of capacitors 412*a* through 412*l* is successively charged by a preceding capacitor and discharges to a succeeding capacitor in each clock cycle. As shown in equation (1), the desired headswitch control voltage, Vhs, e.g., Vhs≧Vth+VDD, can be obtained by properly selecting the number of stages L and/or by providing the proper voltage to the drain of N-FET device 410*a*. Charge pump 230*x* is described in further detail by J. F. Dickson in a paper entitled "On-chip High-Voltage Generation in NMOS Integrated Circuits Using an Improved Voltage Multiplier Technique," IEEE J. Solid-State Circuits, vol. 11, no. 6, pp. 374–378, June 1976.

The output drive capability of charge pump 230*x* does not need to be high. In fact, the drive capability just needs to be large enough to drive the gate capacitance of N-FET headswitch 210 and any leakage current through the parasitic capacitance $C_{gs}$ between the gate and source of the N-FET device(s) used for the N-FET headswitch.

Charge pump 230*x* may be turned off when N-FET headswitch 210 is turned off. This is possible since a low headswitch control voltage, Vhs, turns off the N-FET headswitch. Charge pump 230*x* does not consume current when N-FET headswitch 210 is turned off. The current consumption of charge pump 230*x* is thus not considered in the leakage current budget.

FIG. 4 shows an exemplary embodiment of a charge pump that may be used to provide the headswitch control signal, Vhs. Other charge pump designs may also be used, and this is within the scope of the invention.

FIG. 2 shows an embodiment whereby N-FET headswitch 210 is used as a power switch to either supply or cut off power to a load circuit. The load supply voltage, Vload, is determined by various factors such as the headswitch control voltage, Vhs, provided to the gate of N-FET device 212, the size of N-FET device 212, the saturation or load current, Isat, and so on. The load supply voltage is not regulated and may vary depending on the loading on the headswitch.

Figure 5:
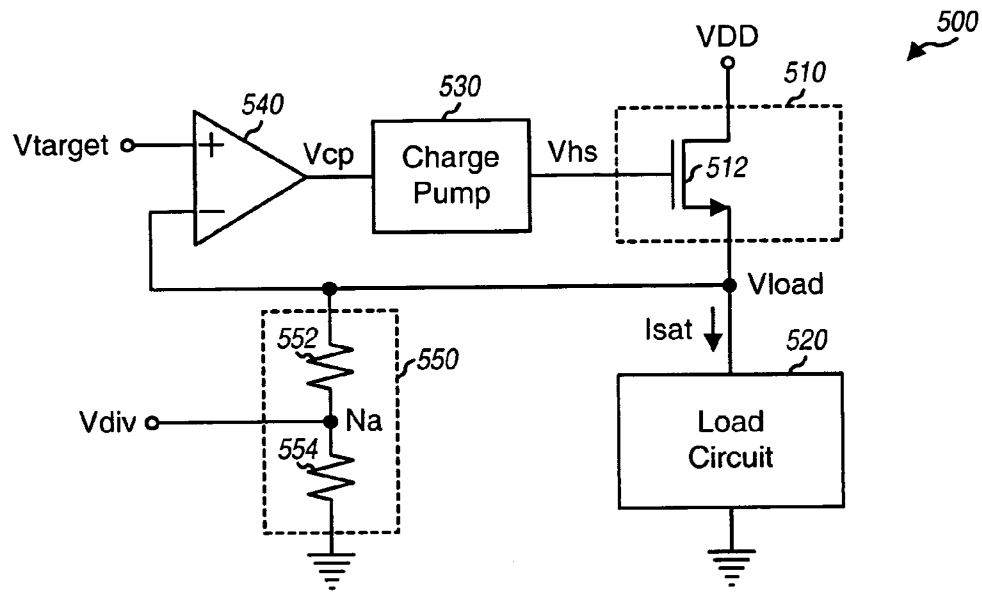
FIG. 5 shows an electronic circuit with an N-FET headswitch used in a linear voltage regulator.

FIG. 5 shows a schematic diagram of an electronic circuit 500 with an N-FET headswitch used in a linear voltage regulator. Circuit 500 includes an N-FET headswitch 510, a load circuit 520, a charge pump 530, and an operational amplifier 540. N-FET headswitch 510 is implemented with an N-FET device 512. N-FET headswitch 510, load circuit 520, and charge pump 530 are coupled as described above for FIG. 2. Amplifier 540 has an inverting input coupled to the load supply, Vload, a non-inverting input that receives a target voltage, Vtarget, and an output that provides a charge pump control signal, Vcp.

Operational amplifier 540, charge pump 530, and N-FET headswitch 510 are also coupled in a feedback configuration and collectively implement a linear voltage regulator. The target voltage, Vtarget, represents the desired voltage for the load supply. The linear voltage regulator adjusts various control signals such that the load supply, Vload, is maintained at the desired voltage and is thus "regulated".

The linear voltage regulator operates as follows. Amplifier 540 senses the load supply voltage, Vload, and compares it against the target voltage, Vtarget. Amplifier 540 then increases or decreases the charge pump control voltage, Vcp, based on the result of the comparison. Charge pump 530 adjusts the headswitch control voltage, Vhs, up or down corresponding to (and possibly proportional with) the changes in the charge pump control voltage, Vcp. The headswitch control voltage, Vhs, determines the $V_{DS}$ voltage drop across N-FET device 512, which then determines the load supply voltage, Vload. For example, if the load supply voltage, Vload, is less than the target voltage, Vtarget, then the charge pump control voltage, Vcp, is increased, which then increases the headswitch control voltage, Vhs. A higher control voltage Vhs turns on N-FET device 512 harder, which then results in a smaller $V_{DS}$ voltage drop and a higher load supply voltage, Vload. The complementary actions occur if the load supply voltage, Vload, is higher than the target voltage, Vtarget.

As also shown in FIG. 5, a divider circuit 550 comprised of two series-coupled resistors 552 and 554 may be coupled between the load supply, Vload, and circuit ground. A divided load supply voltage, Vdiv, is obtained at node Na where resistors 552 and 554 interconnect. The divided load supply voltage, Vdiv, may be provided to the inverting input of operational amplifier 540 instead of the load supply voltage, Vload. Lower voltages at the inputs of amplifier 540 may simplify the design of the amplifier.

Similar to N-FET headswitch 210 in FIG. 2, N-FET headswitch 510 in FIG. 5 may be turned off by bringing the target voltage, Vtarget, low (e.g., to circuit ground). N-FET headswitch 510 may be turned on by bringing the target voltage, Vtarget, high to the desired voltage. The load supply voltage, Vload, may also be adjusted by adjusting the target voltage, Vtarget.

FIG. 5 shows an exemplary embodiment of a voltage regulator that may be used to provide the headswitch control signal, Vhs. Other voltage regulator designs may also be used, and this is within the scope of the invention.

Figure 6:
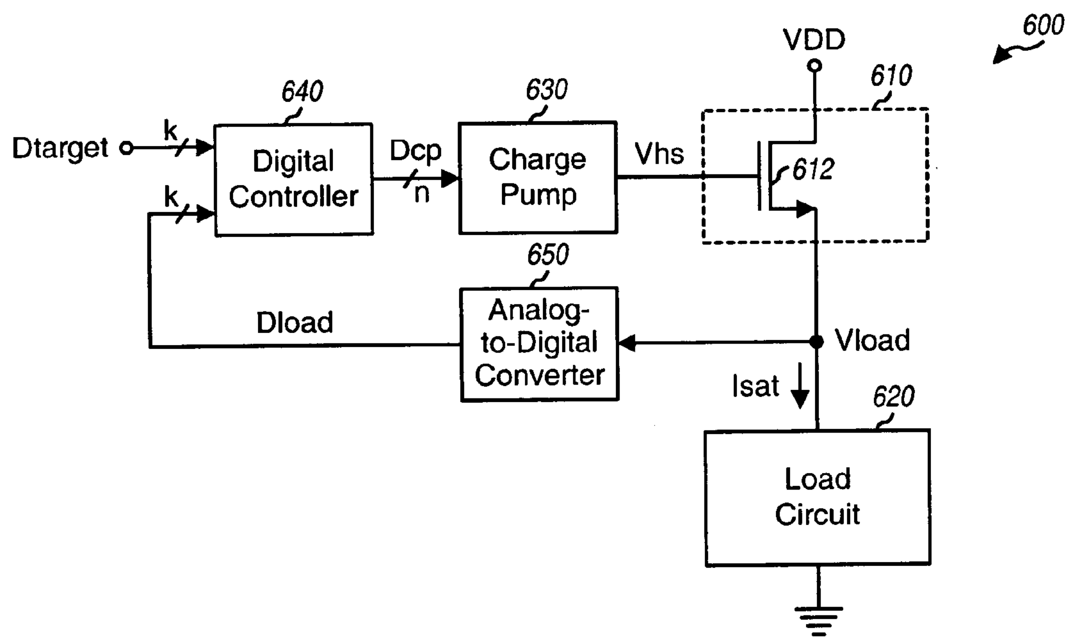
FIG. 6 shows an electronic circuit with an N-FET headswitch used in a digital voltage regulator.

FIG. 6 shows a schematic diagram of an electronic circuit 600 with an N-FET headswitch used in a digital voltage regulator. Circuit 600 includes an N-FET headswitch 610, a load circuit 620, a charge pump 630, a digital controller 640, and an analog-to-digital converter (ADC) 650. N-FET headswitch 610 is implemented with an N-FET device 612. N-FET headswitch 610, load circuit 620, and charge pump 630 are coupled as described above for FIG. 2. Controller 640, charge pump 630, N-FET headswitch 610, and ADC 650 are also coupled in a feedback configuration and collectively implement a digital voltage regulator. The digital voltage regulator adjusts various control signals such that the load supply, Vload, is maintained at the desired voltage indicated by a digital control word, Dtarget.

The digital voltage regulator operates as follows. ADC 650 receives and digitizes the load supply voltage, Vload, and provides a k-bit word Dload, where k is an integer greater than one. Controller 640 receives the k-bit word Dload from ADC 650 and the k-bit control word Dtarget, which is indicative of the desired voltage for the load supply, Vload. Controller 640 then computes the difference ΔD between the received words and provides an n-bit control word Dcp for charge pump 630. The control word Dcp is related to the difference ΔD between the words Dtarget and Dload. In one embodiment, the control word Dcp may be computed as follows:

$$Dcp = Av \cdot (D\text{target} - D\text{load}) - Dos, \quad \text{Eq (2)}$$

where Av is a gain value and Dos is an offset value. In another embodiment, the difference ΔD is provided to a look-up table, which then provides the control word Dcp. The look-up table contains a transfer function between the difference ΔD and the word Dcp.

Charge pump 630 receives the n-bit control word Dcp and adjusts the headswitch control voltage, Vhs, up or down corresponding to (and possibly proportional with) the control word Dcp. In one embodiment, charge pump 630 converts the control word Dcp into an analog signal Vcp, which is then provided to an L-stage voltage multiplier circuit, such as the one shown in FIG. 4. In another embodiment, the n-bit control word Dcp is used to control n-stages of a charge pump. For example, by turning on an appropriate number of stages (from 1 through n), the desired control voltage Vcp can be obtained. This is indicated in equation (1) since Vhs is a function of L, which is the number of stages for the charge pump. In any case, the headswitch control voltage, Vhs, determines the $V_{DS}$ voltage drop across N-FET device 612, which then determines the load supply voltage, Vload. Controller 640 thus adjusts the control word Dcp up or down by the proper amount to maintain the load supply, Vload, at the desired voltage.

Similar to N-FET headswitch 210 in FIG. 2, N-FET headswitch 610 in FIG. 6 may be turned off by providing a low value (e.g., zero) for the control word Dtarget. N-FET headswitch 610 may be turned on by providing a high value for the control word Dtarget. This high value corresponds to the desired voltage for the load supply, Vload. The load supply voltage, Vload, may also be programmed to different voltages with the control word Dtarget.

A digital voltage regulator has various features that may be useful for certain applications. For example, the load supply voltage, Vload, may be easily set and programmed by selecting a proper k-bit digital control word, Dtarget. Different load supply voltages may be easily obtained with different word values for Dtarget. Moreover, different waveforms and/or characteristics may be obtained for the load supply, Vload. For example, the rates at which the load supply, Vload, is powered up and powered down may be controlled by programming a sequence of values for the word Dtarget.

FIG. 6 shows an exemplary embodiment of a digital voltage regulator that may be used to provide the headswitch control signal, Vhs. Other digital voltage regulator designs may also be used, and this is within the scope of the invention An N-FET headswitch can provide various advantages over a P-FET headswitch. Some of these advantages are described below.

First, an N-FET headswitch can provide better leakage current to drive strength tradeoff than a P-FET headswitch. Drive strength or drive capability is typically quantified by the saturation current, Isat, which is the current provided by the headswitch to the load circuit when the headswitch is turned on. It is well known that N-FET devices have higher (electron) mobility than P-FET devices due to device physics. As a result, for an N-FET device and a P-FET device designed to provide the same drive strength (i.e., the same saturation current, Isat), the N-FET device can be much smaller in size than the P-FET device. Since leakage current is strongly related to device size and since a smaller size N-FET device can be used for a given saturation current, Isat, the leakage current of an N-FET headswitch may be much less than that of a P-FET headswitch. Alternatively, an N-FET headswitch can provide much greater drive strength for the same amount of leakage current.

The benefits resulting from the use of an N-FET headswitch instead of a P-FET headswitch may be quantified by the following exemplary designs. For these designs, the N-FET headswitch and P-FET headswitch are both dimensioned to provide drive strength of 300 mA (i.e., Isat=300 mA ) under a worst-case "slow" IC process variation that results in the highest ON resistance. The P-FET and N-FET devices are dimensioned with a length of 0.13 μm, which is the minimum length for 0.13 μm CMOS technology. Table 1 gives the device widths for the N-FET and P-FET headswitches, their ON resistance when the headswitches are turned on, and the leakage current when the headswitches are turned off. The leakage current in Table 1 is obtained for a worst-case "fast" IC process variation that results in the highest possible leakage current for the device.

TABLE 1

| Parameters | P-FET Headswitch | N-FET Headswitch | Units |
|---|---|---|---|
| Device Width | 32 | 5.5 | mm |
| ON resistance $R_{on}$ | 5.26 | 0.91 | Ohms-mm |
| Leakage Current | 157 | 20.5 | μA |

In Table 1, the device width is given in units of millimeter (mm) and the ON resistance is given in units of Ohms-mm. To obtain the ON resistance for each headswitch, the value given in Table 1 is divided by the device width (e.g., 0.91/5.5=0.16 Ohms). The drain-to-source voltage, $V_{DS}$, is approximately 50 mV for the exemplary designs.

As shown in Table 1, the N-FET headswitch provides a better tradeoff between ON resistance and leakage current. The exemplary designs indicate that the N-FET headswitch offers almost eight times (8×) reduction in leakage current over the P-FET headswitch for the same drive strength. The N-FET headswitch further offers almost six times (6×) reduction in die area over the P-FET headswitch for the same drive strength. Both of these benefits (i.e., less leakage current and smaller die area) are highly desirable.

Second, an N-FET headswitch may experience less stress than a P-FET headswitch. To reduce leakage current, the P-FET headswitch is sometimes overdriven with a control voltage that is greater than VDD (e.g., CTRL>VDD+Vth ) to turn off the P-FET device harder. If the drain floats to circuit ground, then the gate-to-drain voltage, $V_{GD}$, will exceed VDD, which then overstresses the P-FET device. To reduce leakage current, the P-FET headswitch is also sometimes dimensioned with a smaller size and overdriven with a control voltage that is lower than circuit ground (i.e., CTRL<0) to turn on the P-FET device harder. The large gate to source voltage (i.e., $V_{GS}$>VDD) also overstresses the P-FET device.

In contrast, for an N-FET headswitch that is operated in the linear region, the gate voltage is $V_G$>VDD+Vth, the source voltage is $V_s$=Vload≈VDD, the drain voltage is $V_D$=VDD, and the gate to source voltage is $V_{GS}$>Vth. In this case, the N-FET device will not be overstressed when it is turned on. For an N-FET headswitch that is turned off, the gate voltage is $V_G$=0, the source voltage is $V_S$≈0, the drain voltage is $V_D$=VDD, and the gate-to-source voltage is $V_{GS}$≈0. The gate-to-source voltage, $V_{GS}$, is less than the power supply voltage when the N-FET device is turned off. The device is also not overstressed when it is turned off. An N-FET headswitch may thus be more reliable (i.e., less prone to failure) and may have a longer life expectancy than a P-FET headswitch.

The N-FET headswitch may be used in various devices and apparatuses. For example, the N-FET headswitch may be used in a wireless device (e.g., a cellular phone), a personal digital assistant (PDA), portable computers, and so on. Moreover, the N-FET headswitch may be used for various end applications such as wireless communication, data communication, networking, computer, and so on. As an example, the N-FET headswitch may be advantageously used in a wireless terminal or a cellular phone for a code division multiple access (CDMA) system, a time division multiple access (CDMA) system, a frequency division multiple access (FDMA) system, a multiple-input multiple-output (MIMO) system, an orthogonal frequency division multiple access (OFDMA) system, or an orthogonal frequency division multiplexing(OFDM) system. A CDMA system may implement IS-95, IS-2000, Wideband CDMA (W-CDMA), and/or some other standards. A TDMA system may implement Global System for Mobile Communications (GSM) and/or some other standards.

The N-FET headswitch described herein may be used for various units. For example, the N-FET headswitch may be used for an application specific integrated circuit (ASIC), a digital signal processor (DSP), a digital signal processing device (DSPD), a programmable logic device (PLD), a field programmable gate array (FPGA), a processor, a controller, a micro-controller, a microprocessor, a static random access memory (SRAM), a digital circuit, an analog circuit, and other electronic units. As noted above, the N-FET headswitch, load circuit, and the charge pump may be implemented within the same or different IC dies and in the same or different ICs.

The N-FET headswitch described herein may also be fabricated with various IC process technologies such as CMOS, NMOS, and so on. CMOS technology can fabricate both N-FET and P-FET devices on the same die, whereas NMOS technology can only fabricate N-FET devices. The N-FET headswitch described herein may be fabricated using different device size technologies (e.g., 0.13 μm, 30 nm, and so on). In general, the N-FET headswitch described herein is more effective and beneficial as the IC process technology scales smaller (i.e., to smaller "feature" or device length).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An electronic circuit in a wireless communication device, the circuit comprising:

a load circuit comprised of at least one field effect transistor (FET) device;

a headswitch comprised of at least one N-channel FET (N-FET) device and coupled between a power supply and the load circuit, wherein the headswitch is operative to couple the power supply to the load circuit when the headswitch is enabled and to cut off the power supply from the load circuit when the headswitch is disabled;

a charge pump coupled to the headswitch, the charge pump selectively enabled based on a charge pump control signal, and operative to control the headswitch based at least in part on the charge pump control signal;

an analog-to-digital converter (ADC) coupled to the headswitch; and a controller coupled to the ADC and the charge pump, wherein the controller, charge pump, headswitch, and ADC are coupled in a feedback configuration to implement a digital voltage regulator, wherein the ADC is operative to convert a load supply voltage provided by the headswitch to the load circuit into a digital signal, wherein the controller is operative to provide a digital control for the charge pump based on the digital signal from the ADC and a digital target value, and wherein the digital control maintains a load supply provided by the headswitch to the load circuit at a selected voltage.

2. The electronic circuit of claim 1, wherein a charge pump output signal for the headswitch has a first voltage when the headswitch is enabled and a second voltage when the headswitch is disabled.

3. The electronic circuit of claim 2, wherein the first voltage is higher than a voltage of the power supply.

4. The electronic circuit of claim 2, wherein the first voltage is equal to or higher than a voltage of the power supply plus a threshold voltage of the at least one N-FET device.

5. The electronic circuit of claim 2, wherein the first voltage results in a drain to source voltage drop across the at least one N-FET device of less than a threshold voltage for the at least one N-FET device.

6. The electronic circuit of claim 1, wherein the at least one N-FET device is fabricated with a high threshold voltage.

7. The electronic circuit of claim 1, wherein the at least one N-FET device is dimensioned with a size to limit power dissipation of the headswitch to within a predetermined percent of total power of the headswitch and load circuit.

8. The electronic circuit of claim 1, wherein the headswitch comprises a plurality of N-FET devices.

9. The electronic circuit of claim 1, wherein the digital target value is programmable to achieve different voltages for the load supply.

10. The electronic circuit of claim 1, wherein the load circuit is a microprocessor.

11. The electronic circuit of claim 1, wherein the load circuit is a digital signal processor.

12. The electronic circuit of claim 1, wherein the load circuit is a memory unit.

13. The electronic circuit of claim 1, wherein the load circuit is an analog circuit.

14. An electronic circuit comprising:
- a load circuit comprised of at least one field effect transistor (FET) device;
- a headswitch comprised of at least one N-channel FET (N-FET) device and coupled between a power supply and the load circuit, wherein the headswitch is operative to couple the power supply to the load circuit when the headswitch is enabled and to cut off the power supply from the load circuit when the headswitch is disabled;
- a charge pump coupled to the headswitch and operative to provide a control signal for the headswitch;
- an analog-to-digital converter (ADC) coupled to the headswitch;
- a controller coupled to the ADC and the charge pump, wherein the controller, charge pump headswitch, and ADC are coupled in a feedback configuration to implement a digital voltage regulator;
- wherein the ADC is operative to convert a load supply voltage provided by the headswitch to the load circuit into a digital signal, wherein the controller is operative to provide a digital control for the charge pump based on the digital signal from the ADC and a digital target value, and wherein the digital control maintains a load supply provided by the headswitch to the load circuit at a selected voltage; and
- wherein the charge pump includes a plurality of stages, and wherein the digital control enables selected ones of the plurality of stages.

15. An integrated circuit in a wireless communication device, the circuit comprising:
- a load circuit comprised at least one field effect transistor (FET) device;
- a headswitch comprised of at least one N-channel FET (N-FET) device and coupled between a power supply and the load circuit, wherein the headswitch is operative to couple the power supply to the load circuit when the headswitch is enabled and to cut off the power supply from the load circuit when the headswitch is disabled;
- a charge pump coupled to the headswitch, the charge pump selectively enabled based on a charge pump control signal, and operative to control the headswitch based at least in part on the charge pump control signal;
- an analog-to-digital converter (ADC) coupled to the headswitch; and
- a controller coupled to the ADC and the charge pump, wherein the controller, charge pump, headswitch, and ADC are coupled in a feedback configuration to implement a digital voltage regulator, wherein the ADC is operative to convert a load supply voltage provided by the headswitch to the load circuit into a digital signal, wherein the controller is operative to provide a digital control for the charge pump based on the digital signal from the ADC and a digital target value, and wherein the digital control maintains a load supply provided by the headswitch to the load circuit at a selected voltage.

16. The integrated circuit of claim 15, wherein the load circuit implements a microprocessor.

17. The integrated circuit of claim 15, wherein the load circuit implements a static random access memory (SRAM).

18. The integrated circuit of claim 15, wherein the load circuit implements a digital signal processor (DSP).

19. The integrated circuit of claim 15, wherein the integrated circuit is fabricated with a complementary metal oxide semiconductor (CMOS) technology of 0.13 μm or smaller.

20. A wireless communication device in a communication system, the device comprising:
- a load circuit comprised of at least one field effect transistor (FET) device;
- a headswitch comprised of at least one N-channel FET (N-FET) device and coupled between a power supply and the load circuit, wherein the headswitch is operative to couple the power supply to the load circuit when the headswitch is enabled and to cut off the power supply from the load circuit when the headswitch is disabled;
- a charge pump coupled to the headswitch, the charge pump selectively enabled based on a charge pump control signal, and operative to control the headswitch based at least in part on the charge pump control signal;
- an analog-to-digital converter (ADC) coupled to the headswitch; and
- a controller coupled to the ADC and the charge pump, wherein the controller, charge pump, headswitch, and ADC are coupled in a feedback configuration to implement a digital voltage regulator, wherein the ADC is operative to convert a load supply voltage provided by the headswitch to the load circuit into a digital signal, wherein the controller is operative to provide a digital control for the charge pump based on the digital signal from the ADC and a digital target value, and wherein the digital control maintains a load supply provided by the headswitch to the load circuit at a selected voltage.

21. The device of claim 20, wherein the communication system is a code division multiple access (CDMA) communication system.

* * * * *